US006323689B1

(12) United States Patent
Morishita

(10) Patent No.: US 6,323,689 B1
(45) Date of Patent: Nov. 27, 2001

(54) SEMICONDUCTOR INTEGRATED CIRCUIT INCLUDING OUTPUT BUFFER CIRCUIT HAVING HIGH RESISTANCE TO ELECTRO-STATIC DISCHARGE

(75) Inventor: Fukashi Morishita, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/088,703

(22) Filed: Jun. 2, 1998

(30) Foreign Application Priority Data

Dec. 8, 1997 (JP) .................................................. 9-337306

(51) Int. Cl.[7] .......................... H01L 25/00; H01L 23/62; H03K 19/00
(52) U.S. Cl. .......................... 326/101; 326/102; 257/355
(58) Field of Search .................................. 326/101, 102; 257/360, 355, 356, 357, 536; 361/56, 111

(56) References Cited

U.S. PATENT DOCUMENTS 5,440,163 * 8/1995 Ohhashi ............................... 257/355
5,739,571 * 4/1998 Kurachi ............................... 257/360

FOREIGN PATENT DOCUMENTS 3-278571 12/1991 (JP) .
4-132253 5/1992 (JP) .

OTHER PUBLICATIONS

"Electrostatic Breakdown Phenomenon of Semiconductor Device and Guideline to Evaluation Method Thereof,"Mar. 1987, (R–61–ES–01) A Foundational Juridical Person, Japanese Electronic Components Reliability Center, pp. 42–25.
"Mitsubishi Seniconductor Reliability Handbook" (Sixth edition, First print, issued Mar. 1997), Mitsubishi Denki Kabushiki Kaisha, p. 73.

* cited by examiner

Primary Examiner—Michael Tokar
Assistant Examiner—Daniel D. Chang
(74) Attorney, Agent, or Firm—McDermott, Will & Emery

(57) ABSTRACT

The interlayer capacitance between a first metal interconnection through which a control signal is transmitted to the gate of a drive transistor and respective power supply interconnections through which a power supply potential and a ground potential is supplied is sufficiently smaller than the interlayer capacitance between an interconnection connecting a drain of the drive transistor and the first metal interconnection. The power supply interconnection is not coupled to a signal input to the gate of the drive transistor.

14 Claims, 11 Drawing Sheets

$$V1 = \frac{Cal}{Cal+Cg} V$$

PRIOR ART

SEMICONDUCTOR INTEGRATED CIRCUIT INCLUDING OUTPUT BUFFER CIRCUIT HAVING HIGH RESISTANCE TO ELECTRO-STATIC DISCHARGE

BACKGROUND OF THE INVENTION

1. Field of the Invention

The present invention relates to a structure of a data output buffer of a semiconductor integrated circuit device.

2. Description of the Background Art

A phenomenon called electrostatic discharge (represented as ESD hereinafter) is seen when a semiconductor device is brought into contact with a material that is discharged electrostatically via a package lead. This discharge phenomenon can cause a high voltage to be applied inside the device to induce breakdown therein.

Various models such as a human body model (referred to as HBM hereinafter), a machine model (referred to as MM hereinafter) and a charged device model (referred to as CDM hereinafter) can be considered with respect to the ESD breakdown. ESD testing according to such models is implemented as one type of reliability testing of a semiconductor device.

A HBM is a model of breakdown generated at the time of electrostatic discharge as a result of a human being with static electricity forming contact with a device. A MM is a model of breakdown generated at the time of electrostatic discharge induced by a metal accumulated with static electricity forming contact with a device. Both models are tested according to the capacitor discharge method shown in the schematic diagram of FIG. 12.

According to the capacitor discharge method, a discharge capacitor CD is connected to a power supply V via a switch SW and a power supply protection resistor RV. As a result, predetermined charge is stored in discharge capacitor CD. At time t1, switch SW is effected to apply a test voltage across the power source pin and the measurement pin of a device DUT via a discharge resistor RD.

The resistance of a device of interest DUT is tested by applying a high voltage.

The applied voltage, the discharged resistance and the like differ in the HBM and MM.

The ESD test was carried out conventionally by the above capacitor discharge method. However, there are some devices that result in ESD breakdown even when the resistance is sufficient in the HBM test and MM test. Therefore, the CDM test is additionally included these few years.

In a CDM test, the breakdown is modeled that occurs at the time of electrostatic discharge when the package lead of a device is charged by friction and the like to cause electrostatic discharge through the terminal of the device.

FIG. 13 is a schematic diagram showing a structure of a tester of the charged device method.

This structure is an example of implementation of the CDM test. Initially, switch SW1 conducts, and the electrode plate where the under-testing device DUT is placed is discharged.

When measurement is carried out, switch SW1 is turned off, and switch SW2 is turned on. Accordingly, power supply voltage V is applied to the electrode plate, and a potential substantially equal to voltage V is applied to the chip and the package lead via the parasitic capacitance Cpkg present between the electrode plate and the semiconductor chip in the under-testing device.

At time t1, a discharge rod is connected to a pin to be measured (a package lead), whereby the potential of the package lead rapidly falls to the level of the ground potential. Device DUT is tested by this sudden discharge.

In a semiconductor device, the internal circuit connected to an external device via the package lead is mainly divided into two types.

The first is the input buffer circuit receiving a signal from an internal pin. The second is the output buffer for transmitting a signal to the internal pin.

FIG. 14 is a circuit diagram showing an example of an input protection circuit inserted between an input buffer circuit and an input pad for the purpose of accommodating ESD breakdown.

In the input buffer circuit of a MOS integrated circuit, an input signal is generally sensed via the gate of a transistor. When a high voltage is directly applied to the gate oxide film, breakdown of the oxide film occurs. The breakdown electric field of a gate oxide film $SiO_2$ is approximately $7 \times 10^6$ V/cm. Therefore, a transistor having a gate oxide film of 10 nm in thickness will be broken down when a voltage of approximately 7 V is applied to the gate thereof.

The input protection circuit of FIG. 14 is inserted to prevent this breakdown. Particularly, a transistor TR1 is called a "field transistor", which serves to prevent ESD breakdown.

A resistor R1 connected between the input pad and the drain of field transistor Tr1 has a resistance of, for example, several ohms. Resistor R1 is formed of an interconnection layer such as of polysilicon.

A resistor R2 having a resistance of 100–200Ω and formed of a diffusion layer and the like is inserted between the drain of field transistor Tr1 and the drain of field transistor Tr2.

By this insertion of a relatively great resistor R2, discharge towards the ground potential is effected by transistor Tr1 before the high voltage from the input pad is transmitted to the internal circuit.

Transistor Tr2 has its drain connected to one end of transistor R2 at the input buffer side and has its source connected to the ground potential. Transistor Tr2 has its gate and source connected. Therefore, transistor Tr2 is diode-connected.

Transistor Tr2 functions to clamp the level of the potential transmitted from the input pad.

FIG. 15 is a sectional view of a field transistor.

In a field transistor, a source S formed of a diffusion layer is isolated from a drain D by an oxide film as in general element isolation. More specifically, the field transistor has a structure in which the gate oxide film is equal in thickness to the oxide film used for element isolation.

When a high voltage is applied from the input towards the drain of the field transistor, the charge will flow towards the ground potential via two paths set forth in the following.

One path is indicated by PA in FIG. 15. The field transistor attains a punch through state, so that charge flows from the drain to the source.

The other path is indicated by PB in FIG. 15. The PN junction between the drain of the field transistor and the substrate exhibits avalanche breakdown, whereby the charge flows towards the substrate. By this charge flow through the current path, the high voltage applied towards the input pad is absorbed.

Here, resistor R2 functions to prevent the electrostatic charge from arriving at the inner circuit before the charge absorption by the field transistor.

By insertion of such elements, ESD breakdown can be reliably suppressed in an input buffer circuit.

FIG. 16 is a circuit diagram showing a structure of a conventional output buffer circuit.

In FIG. 16, a resistor Rout is inserted to compensate for ringing in the output, and has a resistance of approximately several ohms.

An output buffer circuit 2000 includes transistors Q1 and Q2 connected in series between power supply potential Vcc and ground potential GND. Transistor Q1 receives a signal for an H data output at its gate. Transistor Q2 receives a signal for an L data output at its gate. Resistor Rout is connected between the node of transistors Q1 and Q2 and the output pad.

FIG. 17 is a plan view showing a layout of the conventional output buffer circuit 2000 of FIG. 16.

An H data output signal or an L data output signal is transmitted to respective gates of the drive transistor of the output buffer by a first metal interconnection (represented as "1AL" hereinafter) 70.

It is assumed that the first metal interconnection 1AL represents an aluminum interconnection of, for example, the first layer.

A first metal interconnection 71 connects each drain of the drive transistor of the output buffer. A second metal interconnection (represented as "2AL" hereinafter) 72 forms an output pad.

A second interconnection 73 is the power supply interconnection for supplying power supply potential Vcc or GND to a drive transistor.

Here, it is assumed that second metal interconnection 2AL is the aluminum interconnection of, for example, the second layer.

A polysilicon electrode 74 that is the gate electrode of the drive transistor is connected to first metal interconnection 70 via a through hole 76.

First and second metal interconnections 1AL and 2AL are connected via a through hole 75.

The gate electrode, the diffusion layer, the polysilicon resistor and the like are connected to first metal interconnection 1AL via contact hole 76.

A polysilicon resistor 77 corresponds to resistor Rout of FIG. 16.

In output buffer circuit 2000, a portion of the signal generated in the device must be provided to an external device. Therefore, arrangement must be provided so that a great current drive capability of the drive transistor is acquired. It is therefore not possible to use an input protection circuit including a resistor component as in the input buffer circuit.

More specifically, a current of approximately 100 mA, for example, is required to be supplied to the output pad with a power supply voltage of, for example, 3 V.

It is therefore difficult to set a resistor Rout of 100 Ω, for example, in principle.

However, the drive transistor of the output buffer circuit will be greater in size than the other transistors in the device, in other words, has a greater gate width, since the aforementioned current drivability is required. Thus it is therefore possible in principle to absorb the charge efficiently when a high voltage is applied via the PN junction between the source drain and the substrate of the MOS transistor.

However, as mentioned above, there are devices that exhibit ESD breakdown in an output buffer circuit in practice even when the resistance is sufficient in the HBM and MM tests.

SUMMARY OF THE INVENTION

An object of the present invention is to provide a semiconductor integrated circuit device having sufficient CDM resistance while maintaining HBM and MM resistance.

According to an aspect of the present invention, a semiconductor integrated circuit device formed on a main surface of a semiconductor substrate includes an input circuit and an output buffer circuit.

The input circuit generates first and second drive signals complementary to each other according to output data.

The output buffer circuit provides the output data according to the first and second drive signals.

The output buffer circuits includes first and second drive transistor formation regions, an output terminal, a first power supply interconnection, a second power supply interconnection, a first interconnection, a second interconnection, and a third interconnection.

The first and second drive transistor formation regions are arranged along a first direction on the main surface. The first drive transistor formation region includes at least one drive transistor having the potential of the gate extending in the first direction controlled according to the first drive signal.

The second drive transistor formation region includes at least one second drive transistor that has the potential of the gate extending in the first direction controlled according to the second drive signal.

The output terminal is provided between the first and second drive transistor formation regions.

The first power supply interconnection is provided along a second direction on the first drive transistor formation region to supply a first power supply potential to the first drive transistor.

The second power supply interconnection is provided along the second direction on the second drive transistor formation region to supply a second power supply potential to the second drive transistor.

The first interconnection supplies the first drive signal from the output terminal side towards the gate of the first drive transistor.

The second interconnection supplies the second drive signal from the output terminal side towards the gate of the second drive transistor.

The third interconnection transmits the outputs of the first and second drive transistors to the output terminal.

The main advantage of the present invention is that a structure can be provided in which the first and second power supply interconnections and the first and second interconnections do not have interlayer capacitances since the first interconnection supplies a first drive signals from the output terminal side to the gate of the first drive transistor and the second interconnection supplies a second drive signal from the output terminal side to the gate of the second drive transistor. Thus, the CDM resistance can be improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
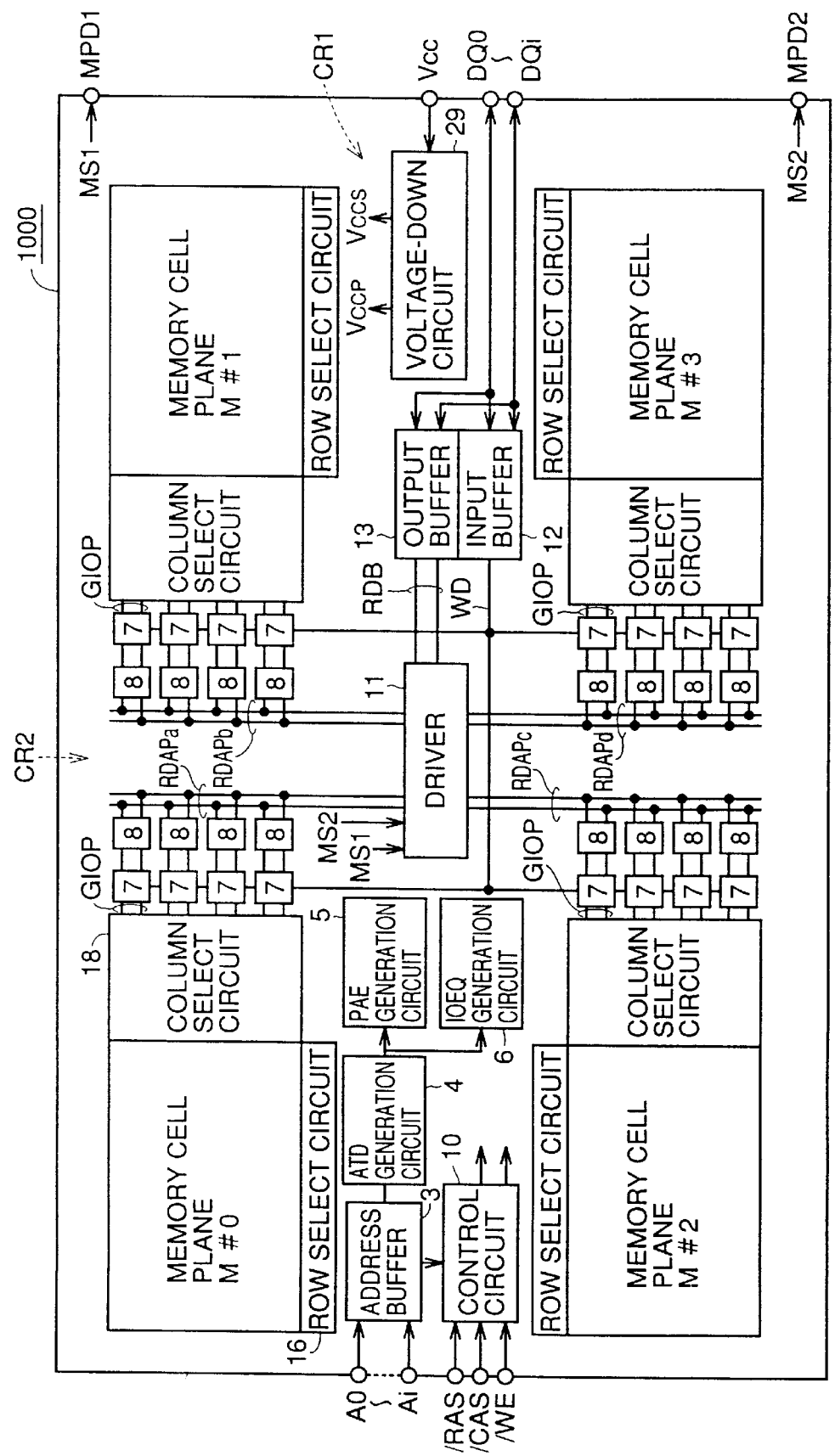
FIG. 1 is a schematic block diagram showing a structure of a DRAM 1000 according to a first embodiment of the present invention.

FIG. 1 is a schematic block diagram showing a structure of a dynamic type semiconductor memory device (referred to as DRAM hereinafter) 1000 according to a first embodiment of the present invention.

Referring to FIG. 1, dynamic semiconductor memory device 1000 includes four memory cell planes M#0–M#3 isolated by center regions CR1 and CR2 that are located along respective directions of the longer and shorter sides.

Semiconductor integrated circuit device 1000 includes a row select circuit 16 (row predecoder, row decoder, and word line driver) and a column select circuit 18 (column predecoder, column decoder and IO gate) corresponding to each memory cell plane for selecting a memory cell according to an externally applied address signal that will be described afterwards.

Each of memory cell planes M#0–M#3 is divided into four groups of columns. A global IO line pair GIOP is arranged corresponding to each group of columns. In the selection of each of memory cell planes M#0–M#3, one bit memory cell is selected in each group of columns to be connected to global IO line pair GIOP of the selected memory cell.

Dynamic semiconductor memory device 1000 further includes a preamplifier/write buffer 7 provided corresponding to each global IO line pair GIOP for the input and output of data with respect to a corresponding global IO line pair GIOP, a read driver 8 provided corresponding to preamplifier/write buffer 7 for amplifying internal readout data from a corresponding preamplifier and transmitting the amplified data to a corresponding readout data bus RDAB (RDABa-TDABd), and a driver circuit 11 receiving the signals on readout data buses RDABa-RDABd to selectively transmit the applied signal to output buffer 13 via an output bus RDB.

By preamplifier/write buffer 7, one of the four groups of columns is selected in each of memory cell planes M#0–M#3. The memory cell data of the selected group of columns is transmitted on corresponding readout data buses RDABa-RDABd via read driver 8.

Dynamic type semiconductor memory device 1000 further includes an address buffer 3 for receiving an externally applied address signal and generating an internal address signal, an ATD generation circuit 4 for detecting a change in the internal address signal (internal column address signal) from address buffer 3 to generate an address change detection signal ATD, a PAE generation circuit 5 responsive to address change detection signal ATD from ATD generation circuit 4 for generating a preamplifier enable signal PAE to render the preamplifier in preamplifier/write buffer 7 active, an IOEQ generation circuit 6 responsive to address change detection signal ATD from ATD generation circuit 4 for generating an equalize designation signal IOEQ to equalize global IO line pair GIOP, and a control circuit 10 receiving an externally applied row address strobe signal /RAS, column address strobe signal /CAS, write enable signal /WE and an internal address signal from address buffer 3 for specifying a predetermined operation mode.

Global IO line pair GIOP is formed of a pair of complementary signal lines to transmit data signals complementary to each other. The potential of the global IO lines of global IO line pair GIOB is set equal by equalize signal IOEQ.

Dynamic semiconductor memory device 1000 further includes an internal voltage-down circuit 29 receiving an externally applied power supply potential Vcc for generating a peripheral circuit power supply voltage Vccp and a memory cell array power supply potential Vccs lower than external power supply potential Vcc. Peripheral circuit power supply potential Vccp is supplied as the operating power supply potential to peripheral circuits such as preamplifier/write buffer 7 and readout driver 8.

Output buffer 13 and input buffer 12 carry out data input/output with an external device via common data input output terminals DQ0–DQi.

The structure of output buffer circuit 13 is described according to the structure of dynamic semiconductor memory device 1000 in FIG. 1. However, the present invention is not limited to the example shown in FIG. 1, and can be applied to an output buffer circuit of a general semiconductor integrated circuit device.

Modeling of CMD breakdown

Figure 17:
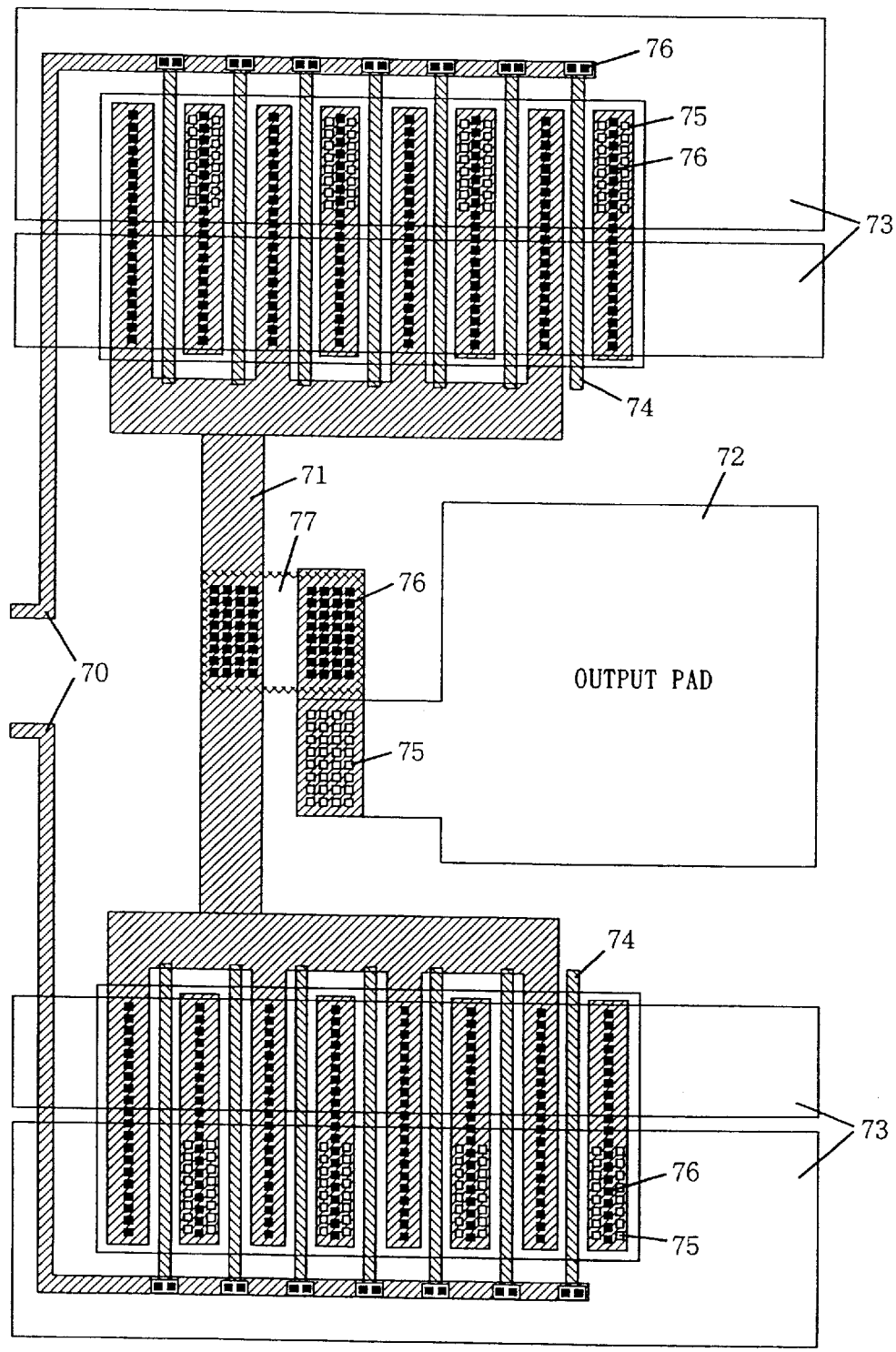
FIG. 17 is a plan view of output buffer circuit 2000.

Consider modeling of CDM breakdown of the output buffer circuit 2000 shown in FIG. 17.

In general, an output buffer circuit 2000 must have a structure in which the drive transistor is arranged under a thick metal power supply interconnection with a current drivability (for example second metal interconnection 2AL) centered about an external pad 72, as shown in FIG. 17.

For this purpose, a metal interconnection (for example, first metal interconnection 1AL) transmitting a signal of the internal circuit to the gate of a drive transistor is provided at an underlayer of power supply interconnection 2AL.

In the device, the power supply line is arranged everywhere. For example, in a DRAM, the power supply interconnection is arranged even on the memory array. 70 to 80 percent of the surface of the chip is occupied by this power supply interconnection.

Figure 13:
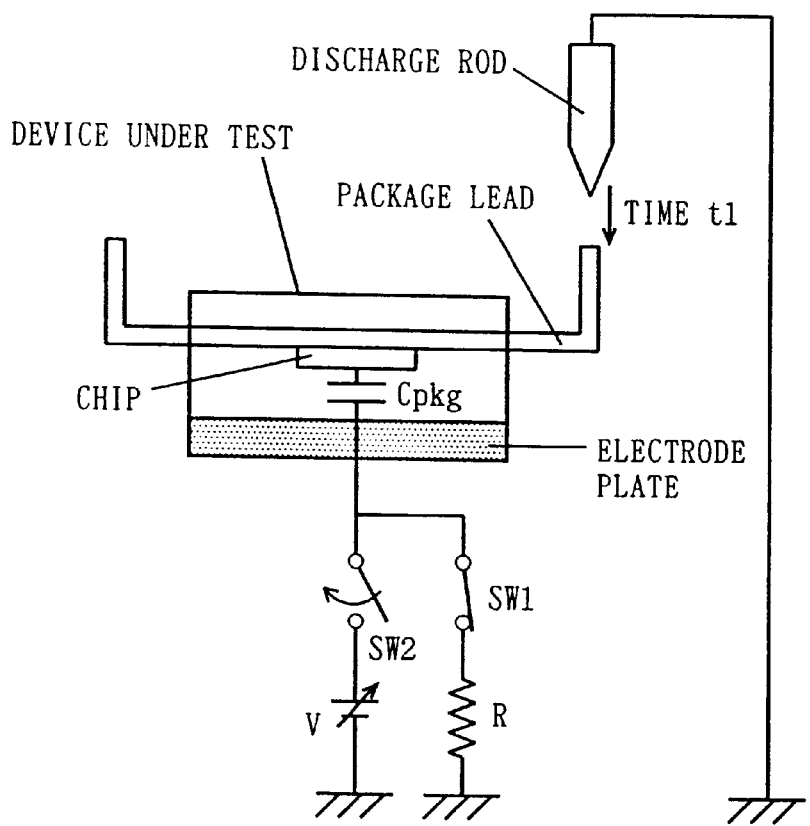
FIG. 13 is a diagram showing a concept of a structure of a conventional charged device method.
Figure 14:
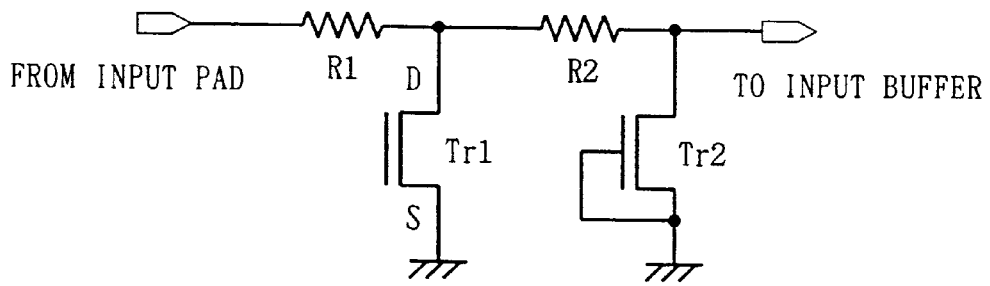
FIG. 14 is a circuit diagram showing a structure of a protection circuit for a conventional input buffer circuit.
Figure 15:
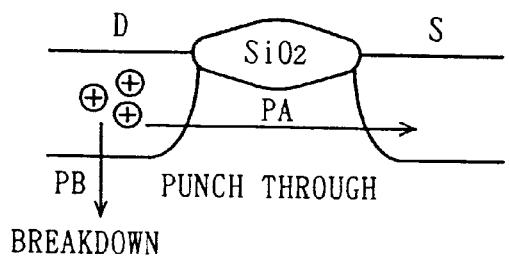
FIG. 15 is a sectional view of a field transistor.
Figure 16:
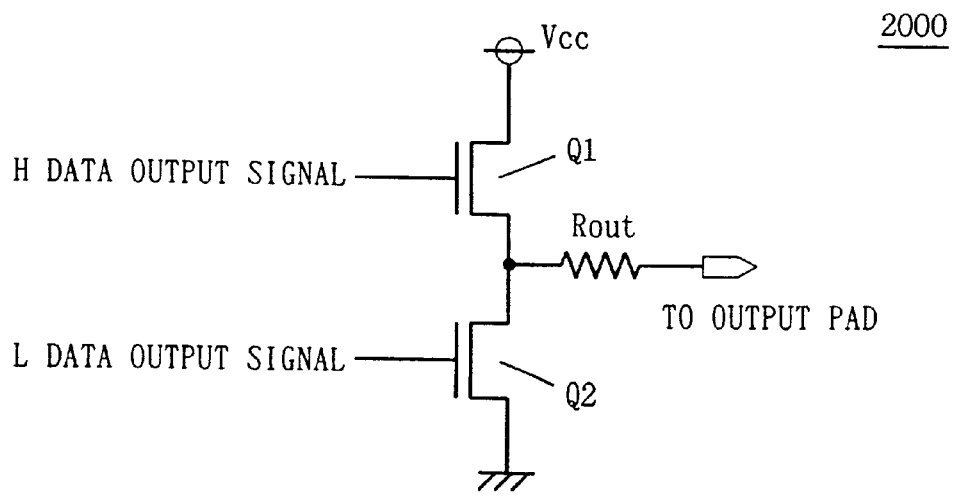
FIG. 16 is a circuit diagram showing a structure of a conventional output buffer circuit 2000.

In the CDM test method shown in FIG. 13, almost all the counter electrode at the part of the package is a power supply interconnection with respect to the electrode plate in the parasitic capacitance Cpkg of the package.

Figure 2:
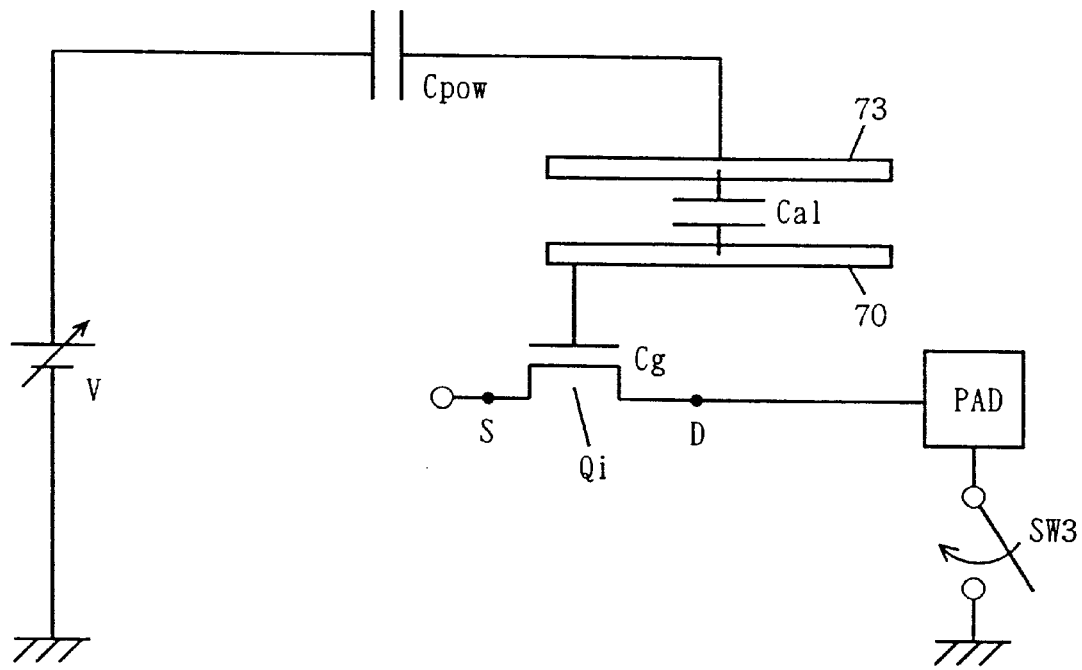
FIG. 2 is a diagram showing the concept of a model with respect to CMD testing on the conventional output buffer circuit 2000 shown in FIG. 17.

It is therefore possible to establish a model as shown in FIG. 2 in the CDM test method shown in FIG. 13.

In FIG. 2, capacitance Cpow is the capacitance that is generated in a parasitic manner between the power supply line and the electrode plate shown in FIG. 13. Capacitance Cal represents the parasitic capacitance of the signal line input to the gate for the drive transistor and the power supply line. Capacitance Cg is the gate capacitance of the drive transistor.

In FIG. 2, drive transistor Qi has its drain connected to the pad. The drive transistor has its source S connected to ground potential GND, for example. In the state where CDM testing is carried out, source S is in a floating state.

Therefore, when sudden discharge is effected via pad PAD by closing switch SW3, i.e. when the discharge rod is brought into connection with the package lead as shown in FIG. 13, a high voltage is applied across the drain and gate of transistor Qi.

In FIG. 2, approximation is effected in which capacitance Cpkg shown in FIG. 13 substantially corresponds to capacitance Cpow.

Figure 3:
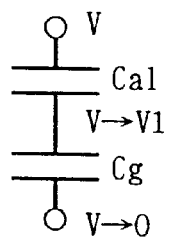
FIG. 3 is a schematic diagram showing a further simplified model of FIG. 2.

If the package capacitance, i.e. the power supply line capacitance Cpow, is sufficiently greater than the parasitic capacitance Call of the power supply line and the signal line, the model shown in FIG. 2 can be substituted with a more simple capacitance model as shown in FIG. 3.

In other words, this model is substantially equivalent to capacitor Call and capacitor Cg connected in series between voltage V and ground potential GND in CDM discharging.

Therefore, the potential difference V1 generated across the ends of the gate capacitance Cg of drive transistor Qi when CDM discharge is carried out is represented by the following equation.

$$V1 = [Cal/(Cal + Cg)] \times V$$

In other words, a state is established in which a great voltage V1 is applied to the gate oxide film of the transistor by CDM discharge. There is a possibility of CDM breakdown depending upon the ratio of the parasitic capacitance of the power supply line and the signal line to the gate oxide film capacitance.

In general, the applied voltage V is 1000 V, for example, in CDM testing.

Assuming that the values of capacitance CAL and capacitance Cg are substantially equal, voltage V1 applied to the gate oxide film of the drive transistor is approximately 500 V. This means that breakdown of the gate oxide film will occur.

Layout taking account of CDM resistance.

Figure 4:
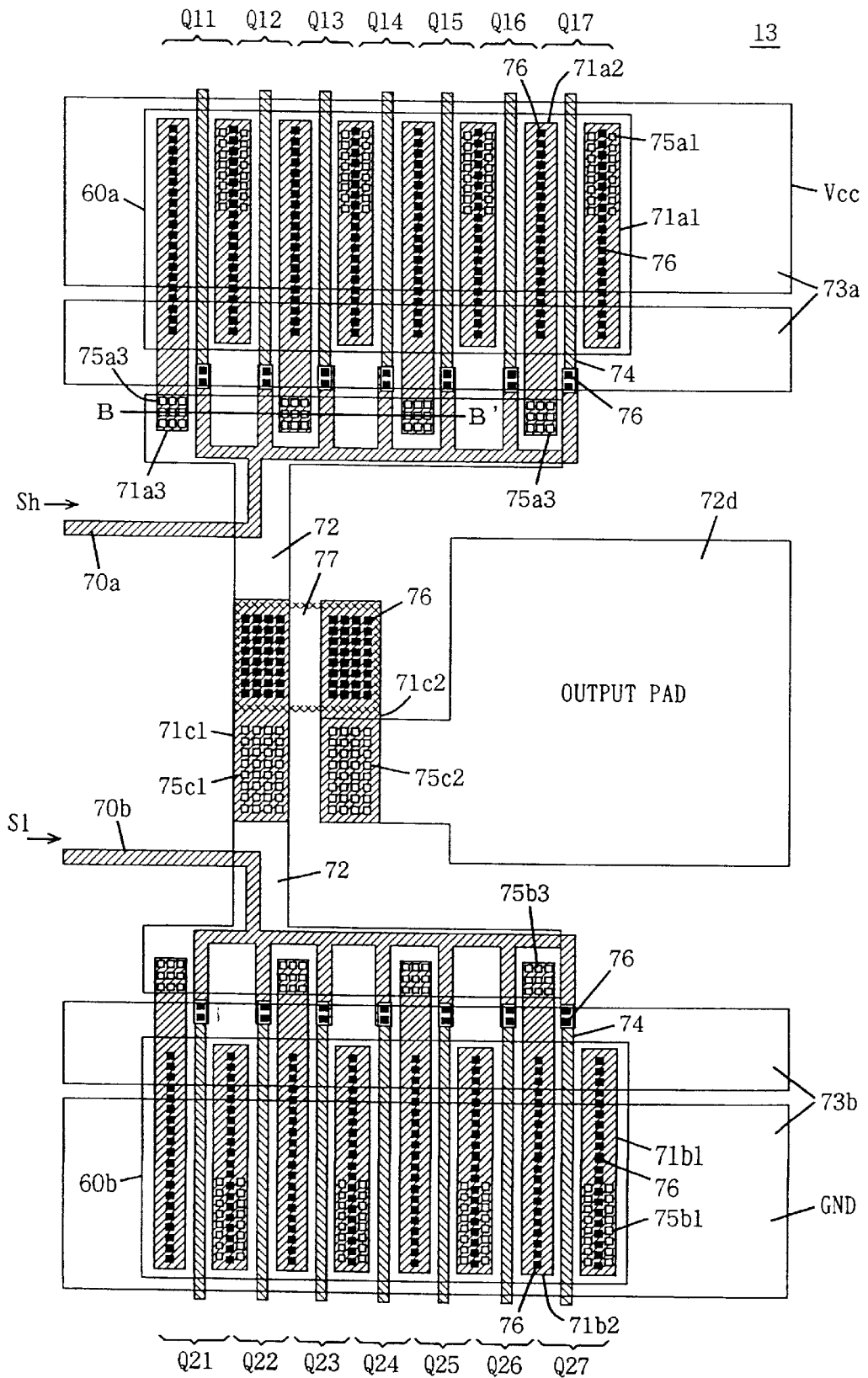
FIG. 4 is a plan view of main components of an output buffer circuit 13 of the first embodiment of the present invention.

FIG. 4 shows the layout of the main components of output buffer circuit 13 of the first embodiment.

In the specification, the metal interconnection of the first layer is referred to as the first metal interconnection, and the metal interconnection of the second layer is referred to as the second metal interconnection hereinafter.

A first insulation film is deposited between the semiconductor substrate and the first metal interconnection layer. A second insulation film is deposited between the first metal interconnection layer and the second metal interconnection layer.

Al interconnection, Al—Si interconnection, Al—Si—Cu interconnection and the like can be employed as the metal interconnection. However, the metal interconnection is not limited to such interconnections. Also, an $SiO_2$ film, a TEOS oxide film, and the like formed by CVD (Chemical Vapor Deposition) can be employed as the insulation film. However, the insulation film is not limited to these films.

A connection hole formed to establish contact between the surface of the semiconductor substrate and the metal interconnection is referred to as a "contact hole". A connection hole formed to establish contact between metal interconnections is referred to as a "through hole".

Referring to FIG. 4, output buffer circuit 13 includes a power supply interconnection 73a for transmitting power supply potential Vcc, a first metal interconnection 71a1 connected to a power supply interconnection 73a via a through hole 75a1, drive transistors Q11–Q17 having respective sources connected to first metal interconnection 71a1 via a contact hole 76, and a first metal interconnection 71a2 connected to respective drains of drive transistors Q11–Q17 via contact hole 76.

Although not particularly limited, drive transistors Q11–Q17 are n channel type MOS transistors formed at an n type well region 60a at the main surface of a p type semiconductor substrate.

A gate electrode (for example, polysilicon electrode) 74 of transistors Q11–Q17 is connected to first metal interconnection 70a that transmits an H data output signal Sh from the internal circuit via contact hole 76.

Output buffer circuit 13 further includes a power supply interconnection 73b for transmitting ground potential GND, a first metal interconnection 71b1 connected to power supply interconnection 73b via a through hole 75b1, drive transistors Q21–Q27 having respective sources connected to first metal interconnection 71b1 via contact hole 76, and a first metal interconnection 71b2 connected to the drain of drive transistors Q21–Q27 via contact hole 76.

Although not particularly limited, drive transistors Q21–Q27 are n channel type MOS transistors formed at an n type well region 60b at the main surface of a p type semiconductor substrate.

A gate electrode (for example, polysilicon electrode) 74 of transistors Q21–Q27 is connected to first metal interconnection 70b that transmits an L data output signal S1 from the internal circuit via contact hole 76.

Output buffer circuit 13 further includes a first metal interconnection 71a2 that is connected to the drain of drive transistors Q11–Q17 via contact hole 76, a first metal interconnection 71b2 connected to the drain of output drive transistors Q21–Q27 via contact hole 76, a second metal interconnection 72 connected to first metal interconnections 71a2 and 71b2 via through holes 75a3 and 75b3, respectively, a first metal interconnection 71c1 connected to second metal interconnection 72 via through hole 75c1, a polysilicon resistor 77 connected to first metal interconnection 71c1 via contact hole 76, a first metal interconnection 71c2 connected to polysilicon resistor 77 via contact hole 76, and a second metal interconnection 72d connected to first metal interconnection 71c2 via through hole 75c2.

Polysilicon resistor 77 is inserted to accommodate ringing of data output from output buffer circuit 13.

Here, second metal interconnection 72d forms the output pad.

Power supply interconnections 73a and 73b are separated into two lines respectively to isolate the interconnection for supplying power supply potential to the output buffer circuit from the interconnection for supplying a power supply potential to the peripheral circuit due to a relatively great swing of the potential level of the power supply interconnection connected to the output buffer circuit since the potential thereof drives a current greater than that of the peripheral circuit.

The layout of FIG. 4 differs from the layout of the conventional output buffer circuit shown in FIG. 17 in the following two issues.

The first issue is that the interconnection led out from the drain of the output drive transistor to the output pad is not the first metal interconnection, but the second metal interconnection 72.

Accordingly, polysilicon 77 forming output resistor Rout and second metal interconnection 72 are connected via first metal interconnection 71c1.

The second issue is that signal Sh or Sl applied to the gate of the output drive transistor is directed towards gate electrode 74 of the transistor from where output pad 72d is located by first metal interconnection 70a or 70b.

Accordingly, interconnection 70a or 70b and second metal interconnection 72 connected to the drain of the output transistor are arranged so as to overlap in different levels in height.

In other words, a structure is provided in which there is an interlayer capacitance between interconnection 70a or 70b that transmits signal Sh or Sl to the gate of the output transistor and second metal interconnection 72 that transmits the potential from the drain of the output transistor to the output pad. Here, this interlayer capacitance is the capacitance corresponding to the overlapping area between two metal interconnections having an interlayer insulation film therebetween.

In FIG. 4, a structure is provided in which seven drive transistors are provided at the side where power supply potential Vcc is supplied to output pad 72d, and seven drive transistors are provided at the side where ground potential GND is supplied to output pad 72d. However, the number of drive transistors is not limited to those in the present embodiment, and an arbitrary number of drive transistors can be provided.

Figure 5:
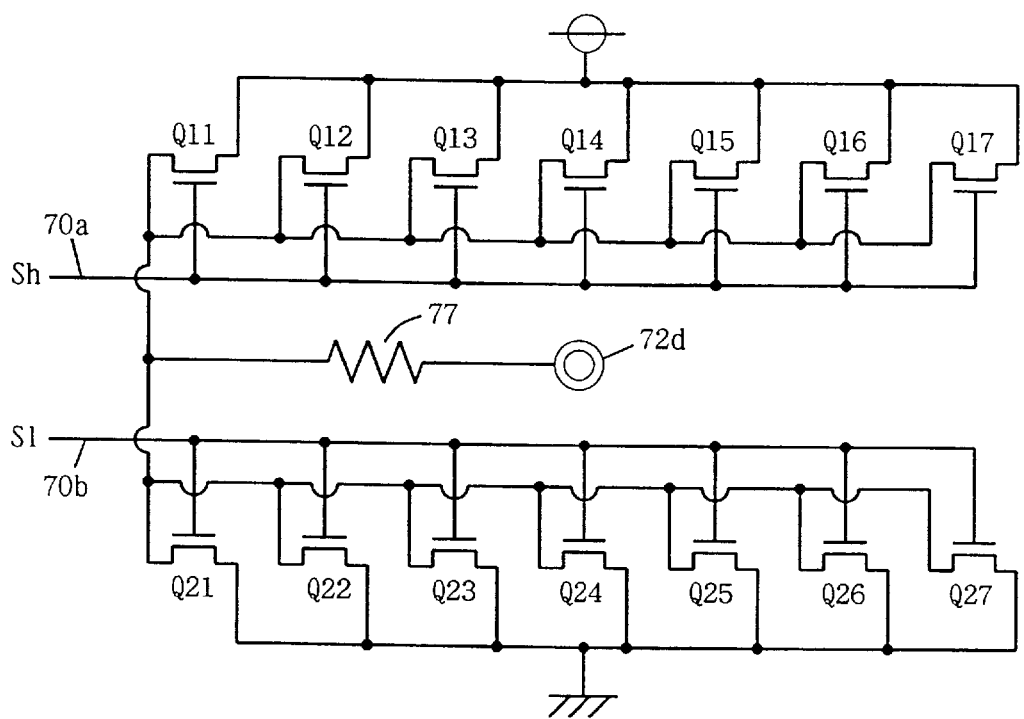
FIG. 5 is a circuit diagram showing main components of output buffer circuit 13 of FIG. 4.

FIG. 5 is a circuit diagram corresponding to the plane pattern of FIG. 4.

The sources of transistors Q11–Q17 receive power supply potential Vcc. The sources of transistors Q21–Q22 receives ground potential GND. Transistors Q11–Q17 receive signal Sh at their gates through interconnection 70a. Transistors Q21–Q27 receive signal Sl at their gates through interconnection 70b.

Transistors Q11–Q17 have their drains and transistors Q21–Q27 have their drains connected to one end of a resistor 77 (for example, polysilicon resistor) by interconnection 72.

Resistor 77 has its other end connected to output pad 72d.

Figure 6:
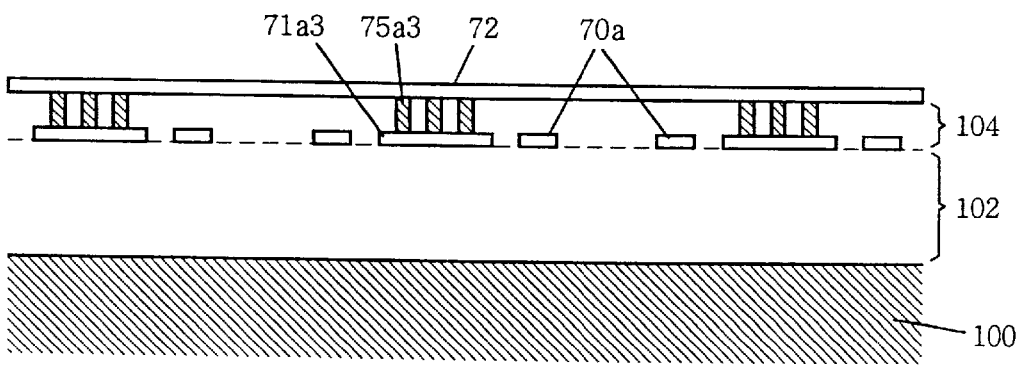
FIG. 6 is a sectional view of output buffer circuit 13 of FIG. 4. taken along line B–B'.

Referring to FIG. 6, a first insulation film (first interlayer insulation film) 102 is formed on a semiconductor substrate 100. First metal interconnections 70a and 71a3 are formed on first insulation film 102.

A second insulation film (second interlayer insulation film) 104 is provided above first insulation film 102 and first metal interconnections 70a and 71a3.

A through hole 75a3 is formed in second insulation film 104 on first metal interconnection 71a3.

Second metal interconnection 72 formed on second insulation film 104 is connected to first metal interconnection 71a3 via through hole 75a3.

Although not depicted, a passivation film is further provided on second metal interconnection 72 in practice.

It is appreciated from FIG. 6 that first and second metal interconnections 70a and 72 face each other via second insulation film 104. An interlayer capacitance Cal2 is present between first and second metal interconnections 70a and 72.

It is appreciated from FIG. 4 that the area where power supply interconnection 73a and first metal interconnection 70a face each other is smaller than the area where first metal interconnection 70a and second metal interconnection 72 face each other. In other words, the interlayer capacitance Cal1 of power supply interconnection 73a and first metal interconnection 70a is sufficiently smaller than the interlayer capacitance Cal2.

Figure 7:
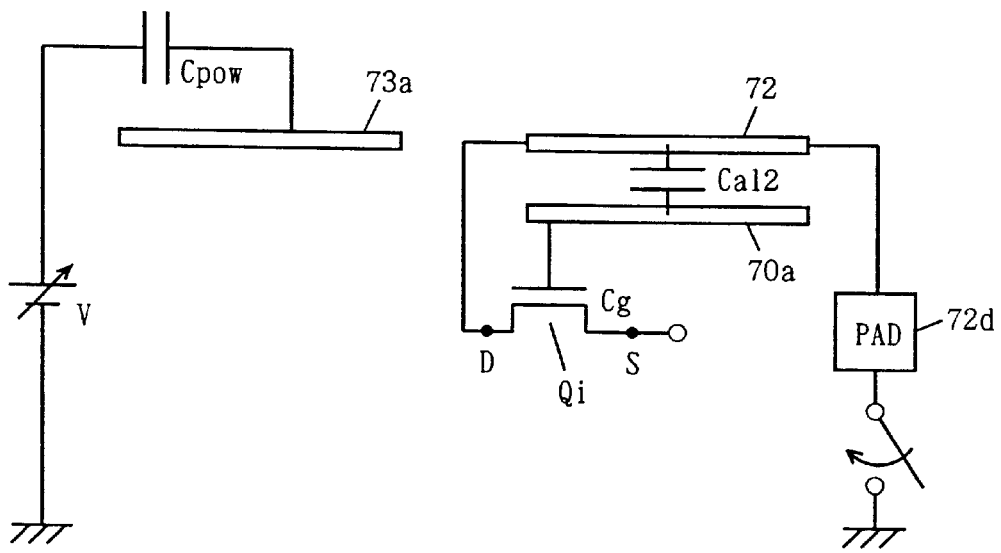
FIG. 7 is a diagram showing the concept of a model with respect to CDM testing on output buffer circuit 13 of FIG. 4.

FIG. 7 is a model circuit diagram of one drive transistor from the structure of output buffer circuit 13 shown in FIG. 4. This is comparable to the model circuit diagram of FIG. 2 of the conventional output buffer circuit.

As described above, interlayer capacitance Cal1 is negligible over interlayer capacitance Cal2. Therefore, the gate of drive transistor Qi is capacitive-coupled to second metal interconnection 72 that connects the drain of drive transistor Qi with output pad 72d as shown in FIG. 7.

In contrast to the conventional case shown in FIG. 2, power supply interconnection 73a and interconnections 70a and 70b through which signals Sh and Sl are supplied to the gate of drive transistor Qi are not capacitive-coupled in the first order approximation.

In other words, capacitance Cpow of the package is not coupled to the signal that is applied to the gate of drive transistor Qi. Therefore, charging voltage V is not applied to the gate oxide film of the drive transistor in the CDM test. Thus, output buffer circuit 13 according to the layout of FIG. 4 is highly impervious to CDM breakdown.

Also, the presence of capacitance Cal2 between pad 72d through which discharge is effected and drive transistor Qi causes the gate potential of drive transistor Qi to exhibit transition following the drain potential in the discharge process. Thus, there is an advantage that application of a high voltage to the gate oxide film of drive transistor Qi is prevented.

Second Embodiment

Figure 8:
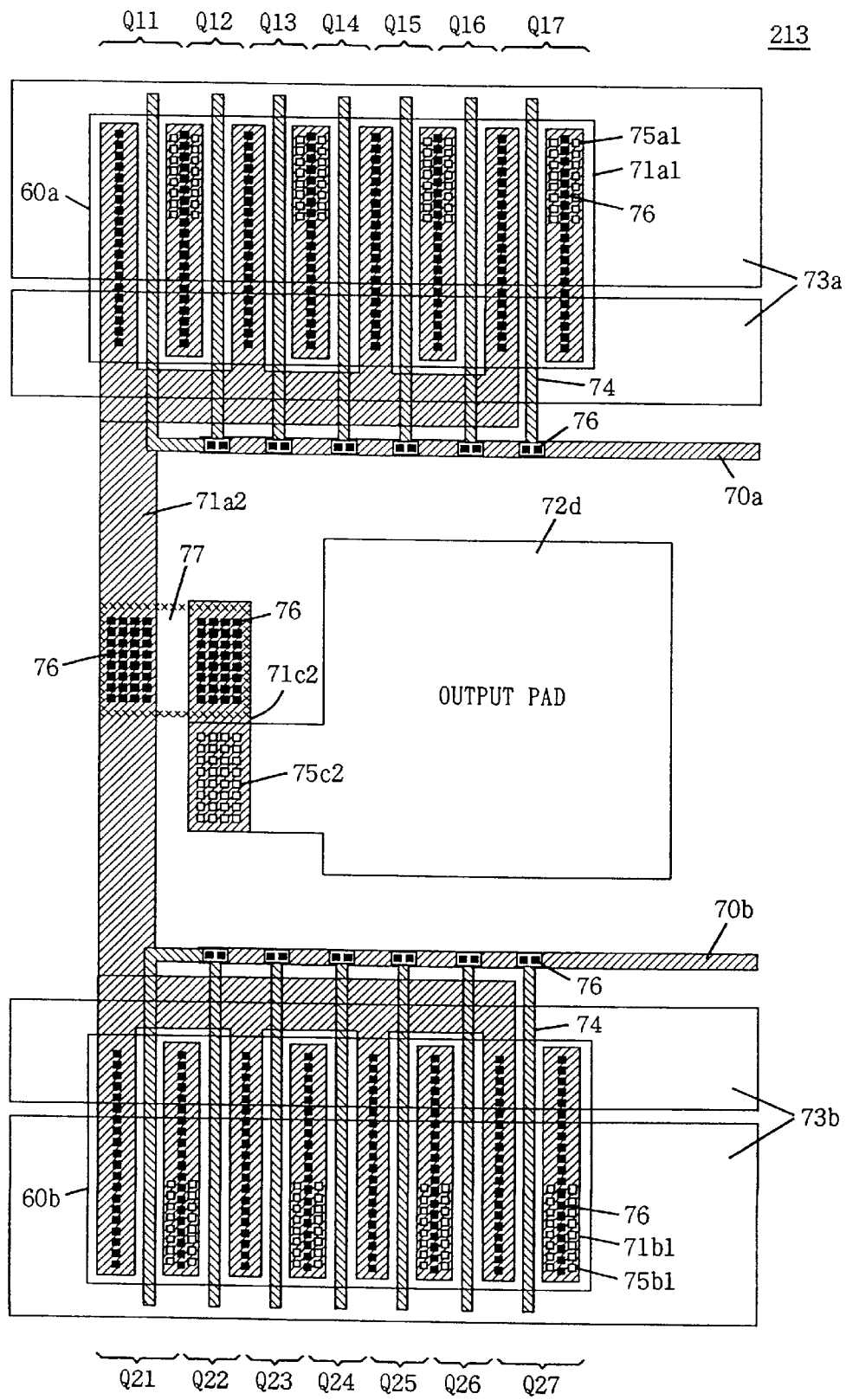
FIG. 8 is a plan view showing main components of an output buffer circuit 213 according to a second embodiment of the present invention.

FIG. 8 shows main components of an output buffer circuit 213 according to a second embodiment of the present invention. The semiconductor integrated circuit device of the second embodiment has a structure similar to that of semiconductor integrated circuit device 1000 of the first embodiment, provided that the structure of output buffer circuit 213 differs.

In the previous embodiment of output buffer circuit 13 shown in FIG. 4, first metal interconnections 70a and 70b through which a signal is transmitted to the gate of a drive transistor is buried under second metal interconnection 72 through which the output from the drain of the drive transistor is transmitted to output pad 72d.

Therefore, the interconnection from the drain of the drive transistor is first pulled up to the second metal interconnection, and then connected to output pad 72d via polysilicon resistor 77, comparable with the conventional output buffer circuit of FIG. 17.

In other words, the drain of the transistor and the output pad are connected through one extra through hole 75c1. It can be said that such increase by the connection hole to pass through may increase the possibility of degrading the reliability other than the CDM resistance.

According to output buffer circuit 213 of the second embodiment, a structure is provided for improving CDM resistance without increasing the connection holes through which the drain of the drive transistor and the output pad are connected in the path.

Referring to FIG. 8, output buffer circuit 213 includes a power supply interconnection 73a for transmitting power supply potential Vcc, a first metal interconnection 71a1 connected to power supply interconnection 73a via a through hole 75a1, drive transistors Q11–Q17 having respective sources connected to first metal interconnection 71a1 through contact hole 76, and a first metal interconnection 71a2 connected with the drain of drive transistors Q11–Q17 via contact hole 76.

Drive transistors Q11–Q17 are similar to those of the first embodiment shown in FIG. 4. Therefore, the description thereof will not be repeated.

A gate electrode (for example, polysilicon electrode) 74 of drive transistors Q11–Q17 extends outside the region covered with power supply interconnection 73a. Gate electrode 74 is connected to first metal interconnection 70a through which an H data output signal Sh from the internal circuit is transmitted via contact hole 76.

Output buffer circuit 213 further includes a power supply interconnection 73b for transmitting ground potential GND, a first metal interconnection 71b1 connected to power supply interconnection 73b via a through hole 75b1, and drive transistors Q21–Q27 having their sources connected to first metal interconnection 71b1 via contact hole 76. The drain of drive transistors Q21–Q27 is connected to first metal interconnection 71a2 via contact hole 76.

Drive transistors Q21–Q27 are similar to those of the first embodiment shown in FIG. 4. Therefore, description thereof will not be repeated.

Gate electrode 74 of transistors Q21–Q27 also extend outside the region covered with power supply interconnection 73b. Gate electrode 74 is connected to first metal interconnection 70b through which a L data output signal Sl from the internal circuit is transmitted through contact hole 76.

Output buffer circuit 213 further includes a polysilicon resistor 77 connected to first metal interconnection 71a2 via contact hole 76, a first metal interconnection 71c2 connected to polysilicon resistor 77 via contact hole 76, and a second metal interconnection 72d connected to first metal interconnection 71c2 via through hole 75c2.

Here, second metal interconnection 72d forms an output pad.

The remaining components of the output buffer of the second embodiment are similar to those of the output buffer circuit of the first embodiment shown in FIG. 4. Corresponding elements have the same reference characters allotted, and their description will not be repeated.

The layout of FIG. 8 differs from the layout of the conventional output buffer circuit of FIG. 17 in the following points.

Signal Sh or Sl applied to the gate of the output drive transistor is transmitted through first metal interconnection 70a or 70b from where output pad 72d is present towards gate electrode 74 of the drive transistor.

Accordingly, first metal interconnection 71a2 led out from the drain of the output drive transistor towards the output pad connects to the section of transistors Q21–Q27 with the section of drive transistors Q11–Q17 on the line where the drain of drive transistor Q11 is connected to the drain of drive transistor Q21.

Also, the gates of drive transistors Q11 and Q21 have an L-shape configuration so as to facilitate contact with first metal interconnections 70a and 70b.

The above-described structure eliminates the presence of an interlayer capacitance between interconnection 70a or 70b through which signal Sh or Sl is transmitted to the gate of the drive transistor and second metal interconnection 72 through which the potential from the drain of the output transistor is transmitted to the output pad.

Also, there is no interlayer capacitance between interconnection 70a or 70b and power supply interconnections 73a and 73b.

Although there are seven drive transistors at the side where power supply potential Vcc is applied to output pad 72d and seven drive transistors at the region where ground potential GND is supplied to output pad 72d, the present invention is not limited to such number of drive transistors. An arbitrary number of drive transistors can be arranged.

Figure 9:
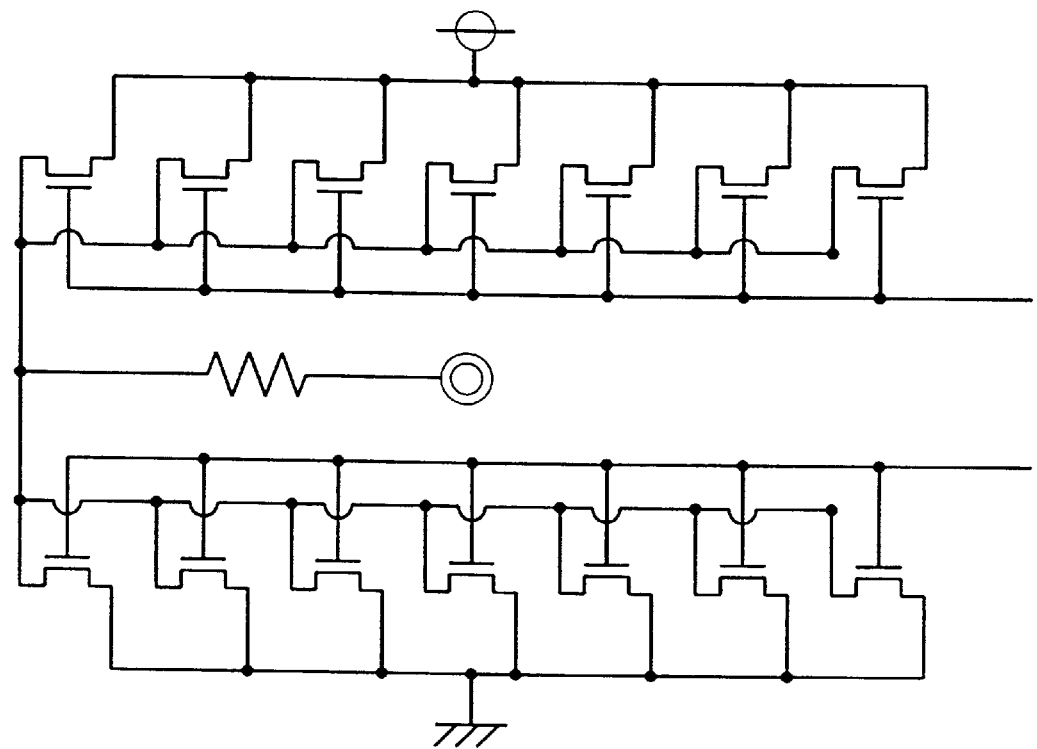
FIG. 9 is a circuit diagram showing main components of output buffer circuit 213 of FIG. 8.

FIG. 9 is a circuit diagram showing a structure corresponding to the plane pattern of FIG. 8. The structure of the output buffer circuit of FIG. 9 is similar to the structure of output buffer circuit 13 of the first embodiment shown in FIG. 5, provided that interconnections 70a and 70b do not cross the line connecting the drains of transistors Q11 and Q21. Corresponding components have the same reference characters allotted, and their description will not be repeated.

Figure 10:
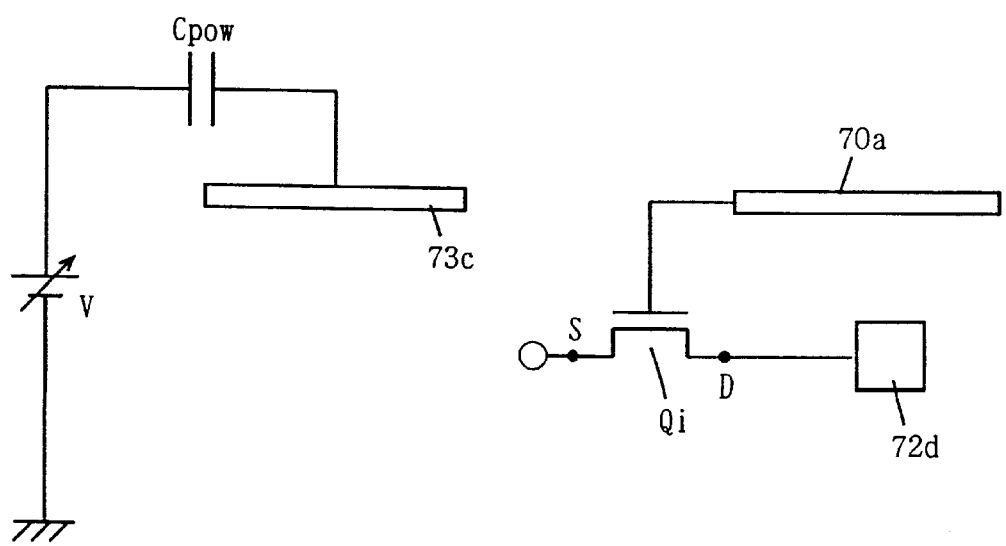
FIG. 10 is a diagram showing a concept of a model with respect to CDM testing on output buffer circuit 213 of FIG. 8.

FIG. 10 is a model circuit diagram of one drive transistor Qi of the structure of output buffer circuit 213 of FIG. 8. This model circuit diagram of FIG. 10 is comparable with the model circuit diagram of FIG. 2 of the conventional output buffer circuit.

Referring to FIG. 10, there is no interlayer capacitance between interconnection 70a or 70b through which signal Sh or Sl is transmitted to the gate of the drive transistor and second metal interconnection 72 through which the potential from the drain of the output transistor is transmitted to the output pad.

Also, there is no interlayer capacitance between interconnection 70a or 70b and power supply interconnections 73a and 73b.

More specifically, a charging voltage V is not applied to the gate oxide film of the drive transistor in a CDM test since capacitance Cpow of the package is not coupled to the signal input to the gate of drive transistor Qi. Therefore, output buffer circuit 213 of the layout shown in FIG. 8 is highly impervious to CDM breakdown.

Similar to output buffer circuit 13 of FIG. 4, when two or more output buffer circuits 213 of FIG. 8 are arranged in close proximity, power supply interconnections 73a and 73b can be provided in common with respect to the plurality of output buffer circuits. Such an arrangement provides the advantage that increase in the layout area can be suppressed even when a plurality of output buffers are arranged in close proximity.

Figure 11:
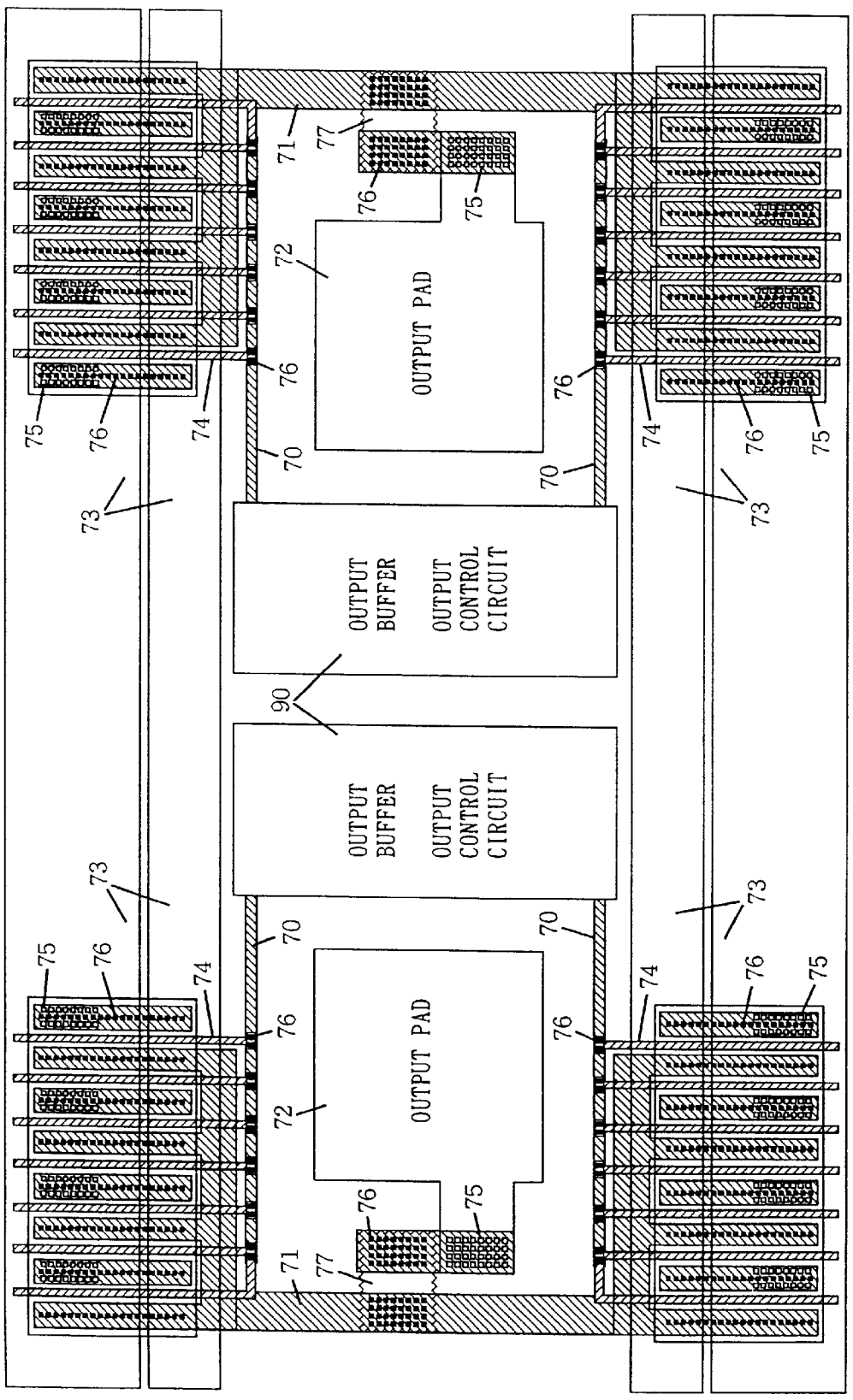
FIG. 11 is a plan view showing an arrangement of a plurality of the main components of output buffer circuit 213 of FIG. 8.
Figure 12:
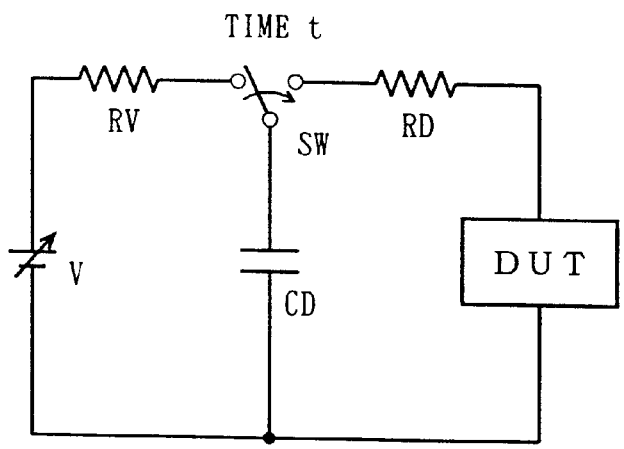
FIG. 12 is a diagram showing a concept of the structure of a conventional capacitor discharge method.

FIG. 11 is a plan view showing an example of at least two output buffer circuits of FIG. 8 arranged in a collocated manner.

Power supply interconnections 73a and 73b are provided in common to a plurality of output buffer circuits. There is no interlayer capacitance between interconnection 70 (interconnections 70a and 70b generically referred to as interconnection 70) through which a signal is transmitted to the gate of drive transistor Qi (Q11–Q17 and Q21–Q27 generically referred to as Qi) from output buffer output control circuit 90 and power supply interconnection 73 (interconnections 73*a* and 73*b* generically referred to as interconnection 73).

By such an arrangement, increase in the layout area can be suppressed even when a plurality of output buffers are arranged in close proximity.

A similar plane pattern can be implemented when two or more output buffer circuits of the first embodiment shown in FIG. 4 are arranged in a juxtaposed manner.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device formed on a main surface of a semiconductor substrate, comprising:
    an internal circuit for generating first and second drive signals according to output data; and
    an output buffer circuit for providing said output data according to said first and second drive signals, said output buffer circuit including
    first and second drive transistor formation regions arranged along a first direction on said main surface,
        said first drive transistor formation region including at least one first drive transistor having a potential of a gate extending in said first direction controlled according to said first drive signal, and
        said second drive transistor formation region including at least one second drive transistor having a potential of a gate extending in said first direction controlled according to said second drive signal,
    an output terminal provided between said first and second drive transistor formation regions,
    a first power supply interconnection provided along a second direction on said first drive transistor formation region for supplying a first power supply potential to said first drive transistor,
    a second power supply interconnection provided along said second direction on said second drive transistor formation region for supplying a second power supply potential to said second drive transistor,
    a first interconnection extending from an output terminal side to said first drive transistor for supplying said first drive signal to the gate of said first drive transistor,
    a second interconnection extending from said output terminal side to said second drive transistor for supplying said second drive signal to the gate of said second drive transistor, and
    a third interconnection for transmitting an output of said first and second drive transistors to said output terminal, wherein
    said first and third interconnections belong to different layers, and overlap each other, and
    said second and third interconnections belong to different layers, and overlap each other.

2. The semiconductor integrated circuit device according to claim 1, wherein
    a plurality of said first drive transistors are provided over said first drive transistor formation region,
    a plurality of said second drive transistors are provided over said second drive transistor formation region, and
    said semiconductor integrated circuit device further comprises a first insulation layer provided in both regions where at least said first interconnection and said third interconnection overlap each other and where said second interconnection and said third interconnection overlap each other.

3. The semiconductor integrated circuit device according to claim 1, further comprising a first insulation film provided on a main surface including said first and second drive transistor formation regions, and
    a second insulation film provided on said first insulation film,
    wherein said first and second interconnections extend along said second direction on said second insulation film, and are connected to respective gates of said first and second drive transistors via first connection holes formed in said second insulation film; and
    said third interconnection includes
    a fourth interconnection formed on said first insulation film, and connected to a drain of said first drive transistor through a second connection hole formed in said first insulation film,
    a fifth interconnection formed on said first insulation film, and connected to a drain of said second drive transistor through a third connection hole formed in said first insulation film, and
    a sixth interconnection formed at a region on said second insulation film including a region on said first and second interconnections, and connected to said fourth and fifth interconnections via fourth connection holes formed in said second insulation film, and coupled to said output terminal.

4. The semiconductor integrated circuit device according to claim 3, wherein
    said first power supply interconnection is formed on said second insulation film, and supplies said first power supply potential to a source of said first drive transistor,
    said second power supply interconnection is formed on said second insulation film, and supplies said second power supply potential to a source of said second drive transistor,
    an interlayer capacitance between said first power supply interconnection and said first interconnection is smaller than the interlayer capacitance between said third interconnection and said first interconnection, and
    an interlayer capacitance between said second power supply interconnection and said second interconnection is smaller than the interlayer capacitance between said third interconnection and said second interconnection.

5. The semiconductor integrated circuit device according to claim 3, further comprising a resistor provided between said sixth interconnection and said output terminal.

6. The semiconductor integrated circuit device according to claim 3, wherein said first and second drive transistor formation regions have a rectangular configuration, and
    wherein said internal circuit includes
    an output control circuit provided at a region sandwiched between an extension line of a side of said first drive transistor formation region along said second direction and an extension line of a side of said second drive transistor formation region along said second direction for providing said first and second drive signals.

7. The semiconductor integrated circuit device according to claim 1, wherein said first and second drive signals are complementary to each other.

8. A semiconductor integrated circuit device formed on a main surface of a semiconductor substrate, comprising:

an internal circuit for generating first and second drive signals according to output data; and an output buffer circuit for providing said output data according to said first and second drive signals, said output buffer circuit including first and second drive transistor formation regions arranged along a first direction on said main surface, said first drive transistor formation region including at least one first drive transistor having a potential of a gate extending in said first direction controlled according to said first drive signal, and said second drive transistor formation region including at least one second drive transistor having a potential of a gate extending in said first direction controlled according to said second drive signal, an output terminal provided between said first and second drive transistor formation regions, a first power supply interconnection provided along a second direction on said first drive transistor formation region for supplying a first power supply potential to said first drive transistor, a second power supply interconnection provided along said second direction on said second drive transistor formation region for supplying a second power supply potential to said second drive transistor, a first interconnection extending from an output terminal side to said first drive transistor for supplying said first drive signal to the gate of said first drive transistor, a second interconnection extending from said output terminal side to said second drive transistor for supplying said second drive signal to the gate of said second drive transistor, a third interconnection for transmitting an output of said first and second drive transistors to said output terminal, and a first insulation film provided on a main surface including said first and second drive transistor formation regions, wherein said first and second interconnections extend along said second direction on said first insulation film, and connected to respective gates of said first and second drive transistors via first and second connection holes formed in said first insulation film, wherein said third interconnection is formed on said first insulation film, and connected to respective drains of said first drive transistor through a third connection hole formed in said first insulation film and of said second drive transistor through a fourth connection hole formed in said first insulation film, wherein the gates of said first and second drive transistors overlap said third interconnection.

9. The semiconductor integrated circuit device according to claim 8, further comprising a resistor provided between said third interconnection and said output terminal.

10. The semiconductor integrated circuit device according to claim 8, wherein said first and second drive transistor formation regions have a rectangular configuration, wherein said internal circuit includes an output control circuit provided in a region sandwiched between an extension line of a side of said first drive transistor formation region along said second direction and an extension line of a side of said second drive transistor formation region along said second direction, for providing said first and second drive signals.

11. The semiconductor integrated circuit device according to claim 8, wherein said first and second drive signals are completmentary to each other.

12. A semiconductor integrated circuit device formed on a main surface of a semiconductor substrate comprising:

an internal circuit for generating first and second drive signals according to output data; and an output buffer circuit for providing said output data according to said first and second drive signals, said output buffer circuit including first and second drive transistor formation regions arranged along a first direction on said main surface, said first drive transistor formation region including at least one first drive transistor having a potential of a gate extending in said first direction controlled according to said first drive signal, and said second drive transistor formation region including at least one second drive transistor having a potential of a gate extending in said first direction controlled according to said second drive signal, an output terminal provided between said first and second drive transistor formation regions, a first power supply interconnection provided along a second direction on said first drive transistor formation region for supplying a first power supply potential to said first drive transistor, a second power supply interconnection provided along said second direction on said second drive transistor formation region for supplying a second power supply potential to said second drive transistor, a first interconnection extending from an output terminal side to said first drive transistor for supplying said first drive signal to the gate of said first drive transistor, a second interconnection extending from said output terminal side to said second drive transistor for supplying said second drive signal to the gate of said second drive transistor, a third interconnection for transmitting an output of said first and second drive transistors to said output terminal, a first insulation film provided on a main surface including said first and second drive transistor formation regions, wherein said first and second interconnections extend along said second direction on said first insulation film, and connected to respective gates of said first and second drive transistors via first and second connection holes formed in said first insulation film, wherein said third interconnection is formed on said first insulation film, and connected to respective drains of said first drive transistor through a third connection hole formed in said first insulation film and of said second drive transistor through a fourth connection hole formed in said first insulation film, and a second insulation film provided on said first insulation film, wherein said first power supply interconnection is formed on said second insulation film, and supplies said first power supply potential to a source of said first drive transistor, wherein said first connection hole is formed on a gate of said first drive transistor extending outside a region covered with said first power supply interconnection, wherein said second power supply interconnection is formed on said second insulation film, and supplies said second power supply potential to a source of said second drive transistor, wherein said second connection hole is formed on a gate of said second drive transistor extending outside a region covered with said second power supply interconnection.

13. The semiconductor integrated circuit device according to claim 12, wherein said first and second drive signals are complementary to each other.

14. A semiconductor integrated circuit device formed on a main surface of a semiconductor substrate, comprising:

an internal circuit for generating first and second drive signals according to output data; and an output buffer circuit for providing said output data according to said first and second drive signals, said output buffer circuit including first and second drive transistor formation regions arranged along a predetermined direction on said main surface, said first drive transistor formation region including a plurality of first drive transistors each having a potential of a gate extending in said predetermined direction controlled according to said first drive signal, and said second drive transistor formation region including a plurality of second drive transistors each having a potential of a gate extending in said predetermined direction controlled according to said second drive signal, an output terminal provided between said first and second drive transistor formation regions, a first power supply interconnection provided over said plurality of first drive transistors for supplying a first power supply potential to said first drive transistors, a second power supply interconnection provided over said plurality of second drive transistors for supplying a second power supply potential to said second drive transistors, a first interconnection extending from an output terminal side to said first drive transistors for supplying said first drive signal to the gates of said first drive transistors, a second interconnection extending from said output terminal side to said second drive transistors for supplying said second drive signal to the gates of said second drive transistors, and a third interconnection for transmitting an output of said first and second drive transistors to said output terminal, wherein said first and third interconnections belong to different layers, respectively and overlap each other, and said second and third interconnections belong to different layers, respectively and overlap each other.

\* \* \* \* \*